United States Patent [19]

Eggerding et al.

[11] Patent Number: 4,540,621
[45] Date of Patent: Sep. 10, 1985

[54] DIELECTRIC SUBSTRATES COMPRISING CORDIERITE AND METHOD OF FORMING THE SAME

[76] Inventors: Carl L. Eggerding, Ethan Allen Dr., Stormville, N.Y. 12582; Edward A. Giess, Susan Dr., Somers, N.Y. 10589

[21] Appl. No.: 518,588

[22] Filed: Jul. 29, 1983

[51] Int. Cl.³ .......................... H05K 3/30; H05K 3/00
[52] U.S. Cl. ..................... 428/209; 428/701; 428/702; 427/96; 501/118
[58] Field of Search ............ 428/209, 701, 702; 501/118, 119, 122; 427/96

[56] References Cited

U.S. PATENT DOCUMENTS

| | | | |
|---|---|---|---|
| 2,731,355 | 1/1956 | Skinner | 501/119 X |
| 3,816,172 | 6/1974 | Hoffman | 428/209 |
| 4,109,377 | 8/1978 | Blazick et al. | 427/126.2 X |
| 4,225,354 | 9/1980 | Rao | 501/119 X |
| 4,385,129 | 5/1983 | Inoguchi et al. | 501/118 |
| 4,403,017 | 9/1983 | Bind | 428/702 |

FOREIGN PATENT DOCUMENTS

| | | | |
|---|---|---|---|
| 0888227 | 1/1962 | United Kingdom | 501/118 |
| 0652142 | 3/1979 | U.S.S.R. | 501/118 |
| 0777017 | 11/1980 | U.S.S.R. | 501/118 |

*Primary Examiner*—George F. Lesmes
*Assistant Examiner*—Nancy A. B. Swisher
*Attorney, Agent, or Firm*—Sughrue, Mion, Zinn, Macpeak, and Seas

[57] ABSTRACT

A method for forming a substrate for electronic applications having a dielectric constant of less than 6 is disclosed. The method comprises admixing crystalline cordierite particles having a size of 0.1—10 microns with a binder and solvent, casting the same into a sheet, drying the cast sheet into a self-supporting green sheet and then heating the green sheet to burn out the binder and to sinter the particles together. A metallization pattern is deposited on the green sheet after the casting but before the heating, the metallization pattern being molybdenum or tungsten. The cordierite has a defined coefficient of thermal expansion. A dielectric substrate for mounting of integrated circuit devices thereon is also disclosed.

11 Claims, No Drawings

DIELECTRIC SUBSTRATES COMPRISING CORDIERITE AND METHOD OF FORMING THE SAME

BACKGROUND OF THE INVENTION

1. Field of the Invention

The present invention relates to low dielectric constant substrates comprising cordierite and methods for forming the low dielectric constant substrates.

The low dielectric constant substrates of the present invention find particular application in forming multilayer ceramic materials.

The substrates may be designed with termination pads for attaching semiconductor chips, connector leads, capacitors, resistors, covers, etc. Three dimensional current networks may be produced using the so-called MLC or multilayer ceramic process in which horizontal circuit patterns that are thick film screened on unsintered or green sheets are connected by using vertical interconnections or vias formed by metal paste filled holes. Individual layers are then laminated and then sintered forming a sintered, dense ceramic/metal package.

2. Description of the Prior Art

A relatively recent innovation in electronic packaging has been the development of the multilayer ceramic (hereafter often MLC) module. In this technology, "green" sheets of ceramic powder held together by a temporary organic binder are metallized with a noble or refractory metal, usually, but not mandatorily, by screen printing. The metallized sheets are stacked, laminated and fired to form a monolithic ceramic-metal package. Details on MLC technology are given in SOLID STATE TECHNOLOGY, May, 1972, Vol. 15, No. 5, pages 35–40, Kaiser et al, hereby incorporated by reference, and U.S. Pat. No. 2,966,719, also hereby incorporated by reference.

Additional procedures for forming laminated green sheets for fabricating multilayer substrates are also disclosed in U.S. Pat. Nos. 3,423,517 and 3,723,176, both hereby incorporated by reference.

IBM Technical Disclosure Bulletin, Vol. 16, No. 4, September, 1973, page 1282, discloses a method of depositing thick gold lines over interconnection metallurgy located on a ceramic substrate. Molybdenum interconnection patterns and via paths are disclosed.

IBM Technical Disclosure Bulletin, Vol. 19, No. 4, September, 1976, page 1259, discloses a plated ceramic module. A layer of ceramic is coated with fritted molybdenum which in turn is coated with a layer of molybdenum to insure a continuous plating of nickel that can be diffused into the entire molybdenum layer.

IBM Technical Disclosure Bulletin, Vol. 19, No. 10, March, 1977, page 3777, discloses the use of high-density sintered molybdenum for internal circuit patterns and for the top and bottom side metallurgy of multilayer ceramic modules. Since the molybdenum is subject to corrosion problems, it is protected during the sintering operation by forming a corrosion-resistant nickel-molybdenum layer thereon.

U.S. Pat. No. 2,731,355 to Skinner discloses magnesium-aluminum-silicate compositions and methods of preparing the same. More particularly, Skinner relates to compositions of this type having high crystalline cordierite development and to methods of producing the same. The compositions are stated to have good electrical properties and low thermal expansion.

U.S. Pat. No. 2,864,919 to Stringfellow discloses ceramic compositions useful as arc extinguishing means in connection with circuit interrupting equipment. The compositions comprise a substantial quantity of cordierite crystals, specifically more than 50% of such crystals, having a specific ultimate composition which can be defined on an $MgO-SiO_2-Al_2O_3$ phase diagram as 5 to 15% MgO, 22 to 58% $Al_2O_3$ and 38 to 63% $SiO_2$.

U.S. Pat. No. 3,040,213 to Byer et al. discloses composite "glaceramic" bodies useful in the fabrication of electrical components such as printed circuits which can be integrally united or interfused to produce a monolithic structure from separate preformed bodies.

U.S. Pat. No. 3,246,972 to Smith et al. discloses that cordierite has been commonly resorted to for the formation of compositions having high thermal shock resistance, high temperature and chemical durability and low thermal expansion but that it suffers from the problem that its expansion coefficient is high enough to limit the thermal shock that articles made therefrom can withstand and to cause excessive warpage of such articles.

U.S. Pat. No. 3,824,196 to Benbow et al. discloses that cordierite has been utilized in catalyst supports.

U.S. Pat. No. 3,885,977 to Lachman discloses an extruded, honeycombed monolithic fired ceramic whose primary crystal phase is cordierite and whose microstructure is characterized by a greater than random orientation of anisotropic cordierite crystallites. The product is particularly adapted for use as a catalytic support matrix for emission control.

U.S. Pat. No. 3,954,672 to Somers et al. discloses cordierite refractory compositions suitable for making a catalyst substrate as well as other ceramic bodies. Somers et al. discloses the firing of green, dried monoliths in air at a temperature of at least 2,550° F. to enable the formation of the maximum amount of cordierite phase.

U.S. Pat. No. 3,993,821 to Goss discloses the use of molybdenum as a metallization for application to green, unfired beryllia ceramics in single or multilayer laminates.

U.S. Pat. No. 4,109,377 to Blazick et al. discloses a method for manufacturing a multilayer ceramic which is particularly suitable for carrying semiconductor chips wherein a particulate mixture containing a metal and the metal's oxide in a ratio of between 1:1 to 9:1 is deposited in a pattern on at least a portion of a plurality of ceramic layers, the patterns are then dried and laminated under substantial pressure and fired at an elevated temperature. The metal oxide allows shrinkage of the metallization so that it more nearly matches that of the ceramic. Preferred metals and metal oxides include molybdenum powder and molybdenum trioxide powder.

U.S. Pat. No. 4,153,491 to Swiss discloses a green ceramic sheet adaptable for accelerated sintering comprising a high alumina ceramic green sheet having an average particle size greater than 1 micron.

U.S. Pat. No. 4,234,367 to Herron et al. discloses the formation of sintered glass-ceramic substrates containing multilevel interconnected thick-film circuit patterns of copper-based conductors obtained by firing in a controlled ambient of hydrogen and $H_2O$ at temperatures below the melting point of copper.

U.S. Pat. No. 4,301,324 to Kumar et al. discloses sintered glass-ceramic substrates containing multilevel, interconnected thick-film circuit patterns of highly conductive metals which can be fired in air or in neutral atmospheres at temperatures below the melting point of the metals. The invention is based upon the discovery that finely divided powders of certain glasses sinter to essentially zero porosity at temperatures below 1,000° C.

Japanese Patent Application No. 53-71269 discloses a multilayer circuit substrate produced by preparing an unfired multilayer ceramic substrate comprising conductor circuit layers each having, as an electroconductive material, a high melting metal powder which can be molybdenum plated with a noble metal.

Japanese Patent Application No. 55-42516 discloses a ceramic circuit board including buried conductor layers and surface conductor layers where the surface conductor layers can be made of molybdenum and include a copper or nickel-copper plated layer.

SUMMARY OF THE INVENTION

It has been found that in the formation of fired dielectric substrates improved product characteristics are obtained if the substrate comprises crystalline cordierite particles.

A method of forming such a dielectric substrate comprises admixing the crystalline cordierite particles with a binder and solvent therefor, casting the mixture into a sheet, drying the cast sheet to form a self-supporting green sheet and then heating the green sheet (herein often a "green ceramic sheet") to burn out the binder and sinter the crystalline cordierite particles together.

One object of this invention is to provide novel dielectric substrates based upon cordierite.

A further object of the invention is to provide a method of making novel dielectric substrates with a high cordierite content which comprises a co-sintered ceramic-metal structure wherein the metal is molybdenum-based.

Another object of the present invention is to provide multilayer ceramic substrates which are compatible with a metallization pattern thereon, most preferably a molybdenum metallization pattern, and co-fireable therewith.

Yet another object of this invention is to provide a method for fabricating multilayer ceramic substrates containing an internal pattern of metallization or conductors, which can be refractory metals or other suitable metals, most preferably of molybdenum.

Still another object of this invention is the fabrication of multilayer ceramic substrate carriers for semiconductor component chips in which conductors, most preferably molybdenum conductors for attachment of chips, are provided at various levels within the substrate carrier.

DESCRIPTION OF PREFERRED EMBODIMENTS

The crystalline cordierite per the present invention can be the naturally occurring magnesium-aluminum-silicate mineral having the theoretical formula $2MgO \cdot 2Al_2O_3 \cdot 5SiO_2$ corresponding to a composition of 13.8% MgO, 34.9% $Al_2O_3$ and 51.3% $SiO_2$.

Synthetic crystalline cordierite products are also useful which are produced by calcining mixtures of talc and clay or other aluminum silicates.

Cordierite is particularly useful per the present invention because of its low coefficient of thermal expansion, its ability to withstand thermal shock and its low dielectric constant.

The crystalline cordierite used in the present invention has a coefficient of thermal expansion of about $15 \times 10^{-7}$ °C.$^{-1}$ measured from 20° to 100° C., when sintered in the range of about 1350° to about 1450° C.

The size of the cordierite per the present invention is not overly important and is selected from those sizes as are conventionally used in the art to form fireable ceramic green sheets. Typically, this is on the order of from about 0.1 to about 10 microns, and this size range can be adjusted by conventional procedures such as ball or vibro-milling, if desired or necessary, to reduce particle size.

It is most preferred that the low dielectric constant substrates of the present invention have a dielectric constant less than about 6.

The Polymeric Binder

As is well known in the art, green ceramic substrates are formed of a particulate ceramic material in combination with a polymeric binder.

With multilayer ceramic materials, there is a subtle interaction between the dielectric constant of the ceramic and the electrical conductivity of the conductor or metallization pattern used. As a general rule, a lower dielectric constant and a higher conductivity for the ceramic substrate and metallization pattern, respectively, are beneficial to the performance of an MLC.

The polymeric binder used in the present invention can be freely selected from those polymeric binders used in the prior art.

In general, these are long chain thermoplastic polymers that are soluble in standard organic solvents such as lower aliphatic alcohols, e.g., methanol, ketones, e.g., acetone, methylisobutylketone (MIBK), etc. A preferred polymeric binder is polyvinyl butyral, e.g., Butvar B-98, available from Monsanto Co., which is approximately 80 mole % polyvinyl acetal, 18–20 mole % polyvinyl alcohol and 0–2.5 mole % polyvinyl acetate. Of course, as one skilled in the art will appreciate, other polymeric binders as are known in the art can be used, e.g., polyvinyl acetate, polymethylmethacrylate, polyvinyl formal, etc. Typically, the polymeric binder is used in combination with a plasticiser for flexibility purposes, e.g., dioctyl phthalate, dibutyl phthalate, dipropylene glycol dibenzoate, etc. While not limitative, weight ratios of polymeric binder to plasticizer of about 10:1 to about 4:1 are typical.

The molecular weight of the polymeric binder is not important per the present invention and can be freely selected from molecular weights as are used in the prior art. As one skilled in the art will appreciate, it is only necessary that the polymeric binder permit easy formation of the slurry which is used to form the green ceramic substrate, provide sufficient strength so that the green sheet may be appropriately handled during processing, and be easily volatilized during sintering to permit clean removal thereof during formation of the fired ceramic substrate.

Optional Ingredients

In the formation of green ceramic sheets, the only essential ingredients are a particulate ceramic material and a polymeric binder illustrating the characteristics as above. .

However, conventional additives as are well known in the art can be used, and generally will be used, in combination therewith, for example, materials from the system $MgO-Al_2O_3-SiO_2$, particularly $Al_2O_3$, $MgAl_2O_4$ and/or crystalline or amorphous aluminosilicates. The purpose of the additive is to enhance mechanical and thermal properties as well as to modify in a favorable fashion sintering behavior. Of particular use is the addition of small amounts of an amorphous aluminosilicate composition comprising MgO, CaO, $Al_2O_3$ and $SiO_2$. These amorphous materials assist the sintering operation such that dense structures can be realized.

The proportion of such additives is not overly important, but typically will be on the order of about 1 to about 15 weight percent based on the weight of the ceramic.

Solvent

The slurry which is utilized to form the green ceramic sheet per the present invention is typically formed using a solvent. The nature of the solvent is not important and is selected from those as are conventionally used in the art. Typically solvents include methanol, toluene, ketones such as acetone, MIBK, methylethylketone, etc., preferably a mixture of methanol and MIBK, e.g., a mixture of methanol and MIBK at a 1:3 weight ratio.

Slurry Proportions

The slurry which is utilized to form the green ceramic sheet of the present invention contains proportions of the desired components as are conventional in the art.

While by no means limitative, typically this will result in an inorganic to organic weight ratio of about 1.5 to 2:1 parts inorganics per 1 part of organics. Of this, the cordierite parts will comprise 85 to 100 weight % of the inorganics, remainder the optional ingredients previously described. The organic portion will comprise 10 to 20 parts by weight of polymeric binder and plasticizer with the remainder being the chosen solvent(s).

Slurry/Green Ceramic Sheet Formation

The slurry and the green ceramic sheet per the present invention are formed following conventional prior art procedures. Reference should be made to the Kaiser et al. article earlier incorporated by reference for disclosure regarding such.

Typically, however, the cordierite and other optional ingredients are weighed out in the proper proportion, particle size is adjusted if desired or necessary, the constituents of the organic binder such as the desired thermoplastic resin, a plasticizer and the solvent(s) are separately blended and then the ceramic phase and the organic phase are weighed out and blended in a ball mill, and the resulting slurry (often called a slip) is cast into tape form by doctor blading onto a web of Mylar ®, the blade spreading the slurry into a uniform film. After the slurry is spread out on the Mylar ® web, it is typically allowed to remain until enough of the solvent has evaporated so that the slurry will not flow when moved. The thus partially dried slurry is allowed to completely dry and is then removed from Mylar ® backing and is ready for use in subsequent operations.

Since typically the green ceramic sheet at this time is rather large in size, usually working blanks are cut from the green ceramic sheet and via holes are selectively punched in a standard grid pattern in the thus formed working blank.

At this stage, if desired, circuit metallization can be formed on the green sheet working blank by silk screening in a conventional manner using a conventional metal paste, e.g., of molybdenum, tungsten or copper metal powders in a conventional organic binder system.

Typically the metal has a particle size on the order of from about 0.5 to about 5.0 microns, though this is not limitative.

If a solvent is used to form the metallization paste, it should be one which is driven off at or below the firing or sintering temperature of the cordierite being used so that only the residual metallization remains after the process is completed.

The via holes are filled in a conventional manner typically by a one-pass screen simultaneously with circuit pattern screening in a conventional manner. Alternatively, two silk screening operations can be used to fill the via holes, one from the bottom using a metal paste followed by one from the top to fill in the holes, and the circuit pattern can be screened simultaneously or subsequently to the via hole filling. This procedure is also conventional.

After the above procedure, typically a stack of green ceramic blanks will be formed which will become the final module.

Generally, a set of working blanks is stacked over registration pins in the proper sequence, the stack is placed in a laminating press and moderate heat and pressure applied, e.g., typically from about 2,000 to about 5,000 psi and about 70° to about 90° C. for about 2 to about 10 minutes, whereupon the thermoplastic binder in the green sheet blank softens and the layers fuse together, deforming around the metallization pattern to completely enclose the lines.

Following the above procedure, the "green module" is fired, typically at about 1300° to about 1450° C. for about 1 to about 5 hours in an atmosphere such as wet hydrogen having a dew point of 30° to 60° C. The purpose of firing is to drive off the binder and to sinter the ceramic and metal particulates together into a ceramic dielectric structure having the desired pattern of electrical conductors extending internally therein.

The module is now ready for various post-sintering operations which are conventional in the art and which are disclosed in detail in the Kaiser et al. article earlier incorporated by reference.

Sintering of the metallization can be appreciably accelerated by reducing the dew point of the sintering atmosphere and/or the particle size of the starting powder. Accordingly, the sintering of, e.g., molybdenum, can be conducted at a temperature on the order of 1,400° C., which is the approximate sintering range of the cordierite-based ceramic systems of the present invention.

It should be understood, of course, that the present invention is not limited to molybdenum as the metallization, and other metals as earlier exemplified can be used with success, the sintering temperature and time being appropriately modified in a manner which will be apparent to one skilled in the art.

Having thus generally described the invention, the following working example is offered to illustrate the same.

EXAMPLE

In this example, the final MLC comprised 12 layers, each layer being 20 mm thick and having the following dimensions: 185 mm × 185 mm. The cordierite composition used had the following composition: 90 wt.% crystalline cordierite and 10 wt.% amorphous aluminosilicate (MgO, CaO, Al$_2$O$_3$ and SiO$_2$). The average particle size thereof was 4 microns.

The binder selected was polyvinyl butyral (Butvar B-98 from Monsanto) with about 20 wt.% dipropylene glycol dibenzoate based on the PVB weight.

The solvent selected was a mixture of methanol and MIBK (1:3 parts by weight).

The cordierite composition, binder and solvent at proportions of 64 weight %, 6 weight % and 30 weight %, respectively, based on slurry weight, were then milled in a conventional fashion.

A green sheet having a thickness of 20 mm was produced from the slurry obtained using a conventional doctor blading method.

The green sheet was then dried in air for 24 hours, whereafter the same was cut into working blanks having the following dimensions: 185 mm × 185 mm and registration holes were punched therein in a conventional manner.

Thereafter, via holes having a diameter of 150 microns were selectively punched on a standard grid pattern in each working blank.

Following the above procedure, the via holes were filled from the bottom and then the top in a conventional manner using a molybdenum metallization paste (85 wt.% solids, balance conventional polymeric binder and solvent).

Thereafter, a wiring pattern was formed by printing the above molybdenum metallization paste on each working blank in a conventional manner, forming the desired metallization pattern on the working blanks.

Following the above procedure, 12 of the above blanks were stacked and laminated together at a temperature of 75° C. and a pressure of 4,000 psi for 5 minutes.

Thereafter, the MLC intermediate was sintered (fired) in a reducing atmosphere, specifically, a water/hydrogen atmosphere having a dew point of 40° C. at 1430° C. for 120 minutes.

Following the above, the essential inventive processing steps of the present invention have been completed and, thereafter, the fired MLC may be subjected to various post-sintering operations as disclosed in the Kaiser et al. publication earlier incorporated by reference.

All of these post-sintering operations are conventional in the art and these operations will be obvious to one skilled in the art.

While there have been described what are at present considered to be the preferred embodiments of this invention, it will be obvious to those skilled in the art that various changes and modifications can be made therein without departing from the invention, and it is, therefore, intended to cover all such changes and modifications as fall within the true spirit and scope of the invention.

We claim:

1. A method for forming a substrate for electronic applications having a dielectric constant of less than 6 comprising;
    admixing crystalline cordierite particles having a size of 0.1–10 microns with a binder and solvent therefor, casting said mixture into a sheet, drying said cast sheet into a selfsupporting green sheet substrate and heating said green sheet substrate to burn out said binder and to sinter said particles together, thereby forming said dielectric substrate, said process further comprising the step of depositing a metallization pattern on said green sheet substrate after said casting but before said heating to sinter, said metallization pattern being of a member selected from the group consisting of molybdenum and tungsten, and wherein said crystalline cordierite has a coefficient of thermal expansion of about $15 \times 10^{-7}$° C.$^{-1}$ measured from 20° to 100° C.

2. The method of claim 1, wherein there is further admixed with the crystalline cordierite particles, binder and solvent one or more crystalline or amorphous materials selected from the group consisting of MgO, CaO, Al$_2$O$_3$ and SiO$_2$.

3. The method of claim 1, including the step of laminating a plurality of said metallized green sheet substrates together.

4. The method of claim 3, including forming an interconnection pattern in at least one of said metallized green sheet substrates.

5. The method of claim 3 or 4, including providing means for extending said patterns to at least one surface of said laminate.

6. The method of claim 1 wherein said metallization pattern is molybdenum.

7. A dielectric substrate for mounting of integrated circuit devices thereon, which dielectric substrate has a dielectric constant less than 6, comprising:
    a substrate of sintered particles of crystalline cordierite, said particles prior to sintering having a size of 0.1–10 microns, and
    at least two space and interconnected levels of electrical conductor patterns embedded in said substrate, said metallization pattern being of a member selected from the group consisting of molybdenum and tungsten, and wherein said crystalline cordierite has a coefficient of thermal expansion of about $15 \times 10^{-7}$° C.$^{-1}$ measured from 20° to 100° C.

8. The substrate of claim 7, including conductor means for extending a portion of said pattern to at least one surface of said substrate as terminals for electrical connection to an external electrical circuit.

9. The substrate of claim 8, including at least one integrated circuit device mounted in electrical connection to said terminals in electrical interconnection to said patterns.

10. The substrate of claim 7 wherein said electrical conductor patterns are molybdenum.

11. The substrate of claim 8 wherein said conductor means is molybdenum.

* * * * *

UNITED STATES PATENT AND TRADEMARK OFFICE
CERTIFICATE OF CORRECTION

PATENT NO. : 4,540,621

DATED : September 10, 1985

INVENTOR(S) : C. L. Eggerding et al

It is certified that error appears in the above-identified patent and that said Letters Patent is hereby corrected as shown below:

Title page:

Please insert as (73) assignee: --International Business Machines Corporation, Armonk, New York--.

Signed and Sealed this

Third Day of June 1986

[SEAL]

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,540,621

DATED : September 10, 1985

INVENTOR(S) : C.L. Eggerding et al

It is certified that error appears in the above-identified patent and that said Letters Patent is hereby corrected as shown below:

Column 6, line 67," 20mm" should read -- .20mm --.

Column 7, line 14, "20mm" should read -- .20mm --.

Signed and Sealed this

Second Day of September 1986

[SEAL]

Attest:

Attesting Officer

DONALD J. QUIGG

Commissioner of Patents and Trademarks